(12) United States Patent
Wu

(10) Patent No.: US 7,645,678 B2
(45) Date of Patent: Jan. 12, 2010

(54) PROCESS OF MANUFACTURING A SHALLOW TRENCH ISOLATION AND PROCESS OF TREATING BOTTOM SURFACE OF THE SHALLOW TRENCH FOR AVOIDING BUBBLE DEFECTS

(75) Inventor: Hsin-Chang Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/674,624

(22) Filed: Feb. 13, 2007

(65) Prior Publication Data

US 2008/0194075 A1    Aug. 14, 2008

(51) Int. Cl.
*H01L 21/76* (2006.01)
(52) U.S. Cl. ............................... 438/424; 257/E21.545
(58) Field of Classification Search ......... 438/424–427, 438/431, 432, 434, 435, 437, 440, 704; 258/E21.548, 258/E21.549, E21.55, E21.545, E21.546
See application file for complete search history.

(56) References Cited

U.S. PATENT DOCUMENTS 5,925,575 A * 7/1999 Tao et al. .................... 438/692
5,956,598 A * 9/1999 Huang et al. ................ 438/424
6,037,238 A   3/2000 Chang
6,660,642 B2 12/2003 Zheng et al.
7,018,929 B2  3/2006 Chen et al.
2002/0004281 A1* 1/2002 Lee et al. .................... 438/424
2004/0014296 A1* 1/2004 Kwak et al. ................. 438/424
2005/0148153 A1* 7/2005 Takahashi .................... 438/424
2007/0032039 A1  2/2007 Chen et al.

* cited by examiner

*Primary Examiner*—Brook Kebede
(74) *Attorney, Agent, or Firm*—Winston Hsu

(57) ABSTRACT

The present invention discloses a process of manufacturing an STI for avoiding bubble defects, in which, after the shallow trench is formed by etching, substance containing carbon or oxygen on the bottom of the shallow trench is removed, and then the process is continued to accomplish the STI. Alternatively, the removal of substance containing carbon or oxygen may be performed after the oxide liner and the silicon nitride liner are formed on the bottom surface of the shallow trench. The present invention also discloses a process of treating bottom surface of the shallow trench. After the bottom surface of the shallow trench is treated, the bubble defects due to the use of the silicon nitride liner can be avoided.

6 Claims, 13 Drawing Sheets

PROCESS OF MANUFACTURING A SHALLOW TRENCH ISOLATION AND PROCESS OF TREATING BOTTOM SURFACE OF THE SHALLOW TRENCH FOR AVOIDING BUBBLE DEFECTS

BACKGROUND OF THE INVENTION

1. Field of the Invention

The present invention relates generally to a semiconductor fabrication method and, more particularly, to an improved shallow trench isolation (STI) process and a process of treating bottom surface of the shallow trench to avoid bubble defects induced by the silicon nitride liner formed on the shallow trench bottom.

2. Description of the Prior Art

In the fabrication of semiconductor devices, isolation structures such as shallow trench isolation (STI) are formed between active areas in which electrical devices such as transistors or memory cells are to be formed. The isolation structures are formed in an early stage of the processing of a semiconductor substrate, typically prior to the formation of the transistors.

To form the STI structure, a pad oxide layer and a pad nitride layer are typically formed over the substrate surface and patterned to expose only the isolation regions, with the prospective active device regions covered. The pad nitride layer acts as a hard mask during subsequent processing steps, and the pad oxide layer functions to relieve stress between the underlying silicon substrate and the pad nitride layer. These two layers can be together called as a hard mask layer.

A dry etch is then performed to form a shallow trench through the nitride, pad oxide layer, and substrate. Dielectric material such as high-density plasma chemical vapor deposition (HDPCVD) oxide is then deposited to fill the shallow trench. Thereafter, the excess dielectric material is polished away using a chemical mechanical polishing (CMP) process and the pad nitride layer is removed.

For a good insulating quality, after the shallow trench is formed by etching, a thermal oxidation is performed to form an oxide liner with a thickness of about 150 angstroms (Å) on the walls and bottom of the shallow trench and etching damage is eliminated at the same time. Before the shallow trench is filled with a dielectric layer, a thin silicon nitride liner is typically deposited using a CVD process to form a double layer structure, serving as an effective oxygen barrier to block oxygen diffusion, and to reduce lattice defects generated in the silicon substrate. However, after a dielectric layer is filled in the shallow trench using an HDPCVD process, some bubble defects are often found between the oxide liner and the silicon substrate. Such defects lead to delamination between the oxide liner and the silicon substrate and influence properties of products.

Therefore, there is still a need for an improved process to make an STI to prevent the bubble defects.

SUMMARY OF THE INVENTION

The main objective of the present invention is to provide an improved STI process and also to provide a process of treating a bottom surface of a shallow trench, to avoid the bubble defects as described above.

The process of manufacturing an STI for avoiding bubble defects according to the present invention comprises steps as follows. A semiconductor substrate comprising a pad oxide layer and a pad nitride layer formed thereon is provided. A photoresist layer is formed on the pad nitride layer. A photolithography process is performed to pattern the photoresist layer and expose a part of the pad nitride layer. The exposed pad nitride layer and the pad oxide layer underneath the pad nitride layer are etched to form an opening. The semiconductor substrate is etched through the opening to form a shallow trench. The photoresist layer is removed, and thereby a substance containing carbon or oxygen remains on a bottom surface of the shallow trench. The substance containing carbon or oxygen on the bottom surface of the shallow trench is removed. An oxide liner is formed on the surface of the shallow trench. A silicon nitride liner is formed on the oxide liner. A chemical vapor deposition process is performed to deposit a dielectric layer to fill the shallow trench.

According to another embodiment of the present invention, the process of manufacturing an STI for avoiding bubble defects comprises steps as follows. A semiconductor substrate comprising a pad oxide layer and a pad nitride layer formed thereon is provided. A photoresist layer is formed on the pad nitride layer. A photolithography process is performed to pattern the photoresist layer and expose a part of the pad nitride layer. The exposed pad nitride layer and the pad oxide layer underneath the pad nitride layer are etched to form an opening. The semiconductor substrate is etched through the opening to form a shallow trench. The photoresist layer is removed, and thereby a substance containing carbon or oxygen remains on a bottom surface of the shallow trench. An oxide liner is formed on the surface of the shallow trench. A silicon nitride liner is formed on the oxide liner. After the silicon nitride liner is formed, the substance containing carbon or oxygen is removed by heating the bottom surface of the shallow trench. After the substance containing carbon or oxygen is removed by heating the bottom surface of the shallow trench, a chemical vapor deposition process is performed to deposit a dielectric layer to fill the shallow trench.

The process of treating bottom surface of a shallow trench for avoiding bubble defects according to the present invention comprises steps as follows. A semiconductor substrate comprising a shallow trench formed by etching is provided. A photoresist layer utilized in the process has been removed and the bottom surface of the shallow trench has a substance containing carbon or oxygen. The substance containing carbon or oxygen is removed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
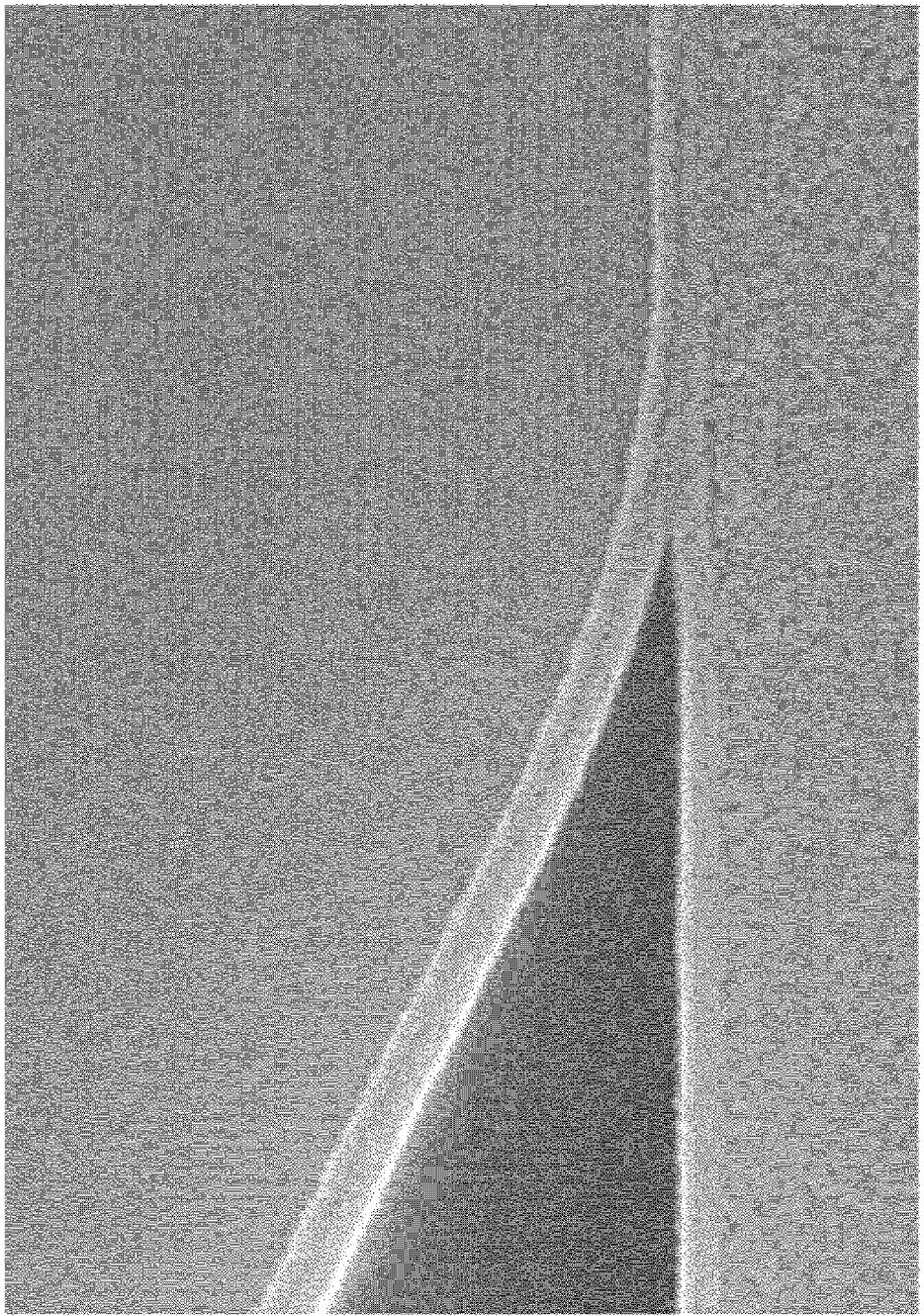
FIG. 1 is a photograph of a scanning electron microscope showing a bubble defect on the bottom of a shallow trench formed according to a prior art.
Figure 2:
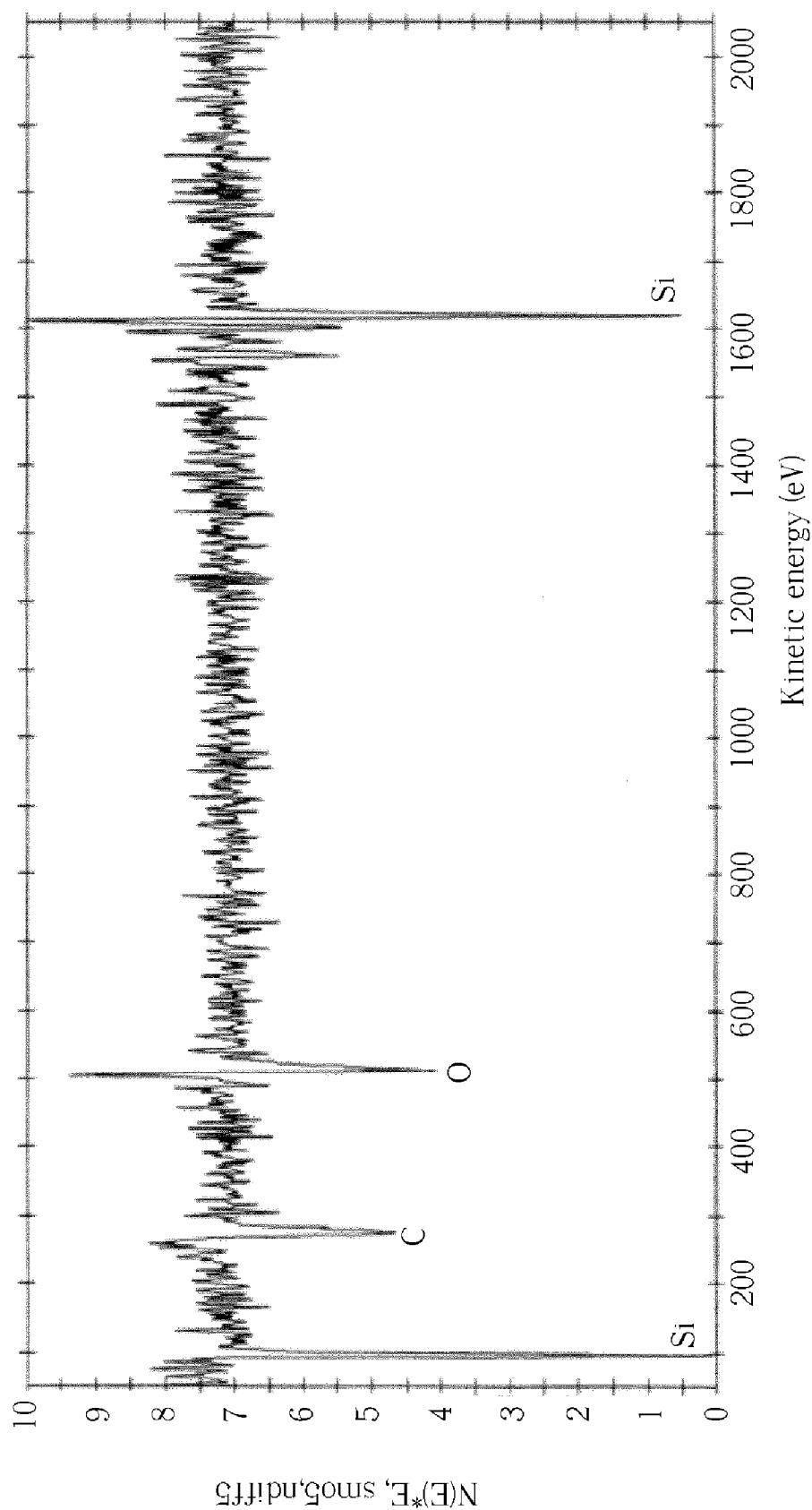
FIG. 2 is a graph of the result from Auger electron spectroscopy of a bottom surface of a shallow trench formed by etching according to a prior art.

The inventor studied and found that the above-mentioned bubble defects occur because the amorphous silicon layer of the substrate surface (i.e. the bottom of the shallow trench) contains carbon and oxygen, leading the poor adhesion between the silicon substrate and the follow-up formed oxide liner. After forming the nitrogen silicon liner layer, stress effect aggravates the poor adhesion to result in a ridge phenomenon, as shown in FIG. 1, and, in turn, to influence follow-up manufacturing processes and yields. Specifically, after the shallow trench is formed by etching, some substances are found on the amorphous silicon layer of the shallow trench bottom, and such substances affect the subsequent manufacturing processes. The shallow trench surface obtained from etching was analyzed by Auger electron spectroscopy and carbon and oxygen were found. FIG. 2 shows the analyzing result and silicon, carbon, and oxygen all exist in the silicon surface layer. The layer cannot be removed by a typical RCA cleaning solution.

Figure 3:
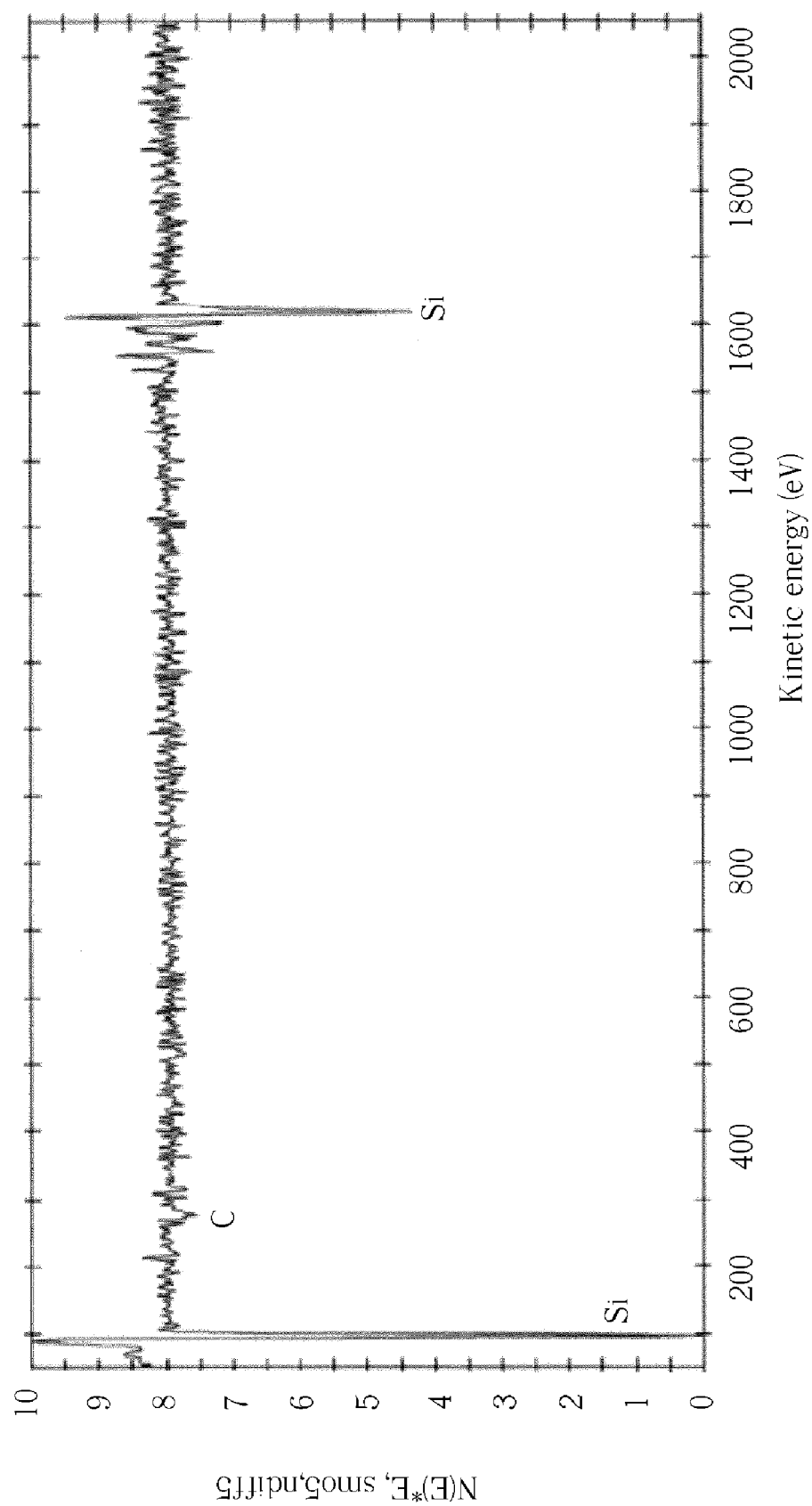
FIG. 3 is a graph of the result from Auger electron spectroscopy of a bottom surface of a shallow trench formed by etching and surface-treated in the process according to the present invention.

However, the inventor found when using an inert gas to bombard the trench bottom surface to remove a surface amorphous silicon layer, substance containing carbon and oxygen adsorbed or bound on the surface can be removed simultaneously. Through such treatment, the bubble defects are effectively avoided. FIG. 3 is a graph of the result from Auger electron spectroscopy of a bottom surface of a shallow trench formed by etching as that shown in FIG. 2 and further surface-treated using an argon plasma sputtering process to remove a thin layer. As the result shown, silicon exists, and the carbon and the oxygen are substantially removed. It indicates that the substance containing carbon or oxygen can be removed together with the removal of the thin silicon layer. And, after the oxide deposits and fill-ups the shallow trench, bubble defects are not found. Thus, the bubble defects are avoided after the removal of the substance containing carbon or oxygen.

Figure 4:
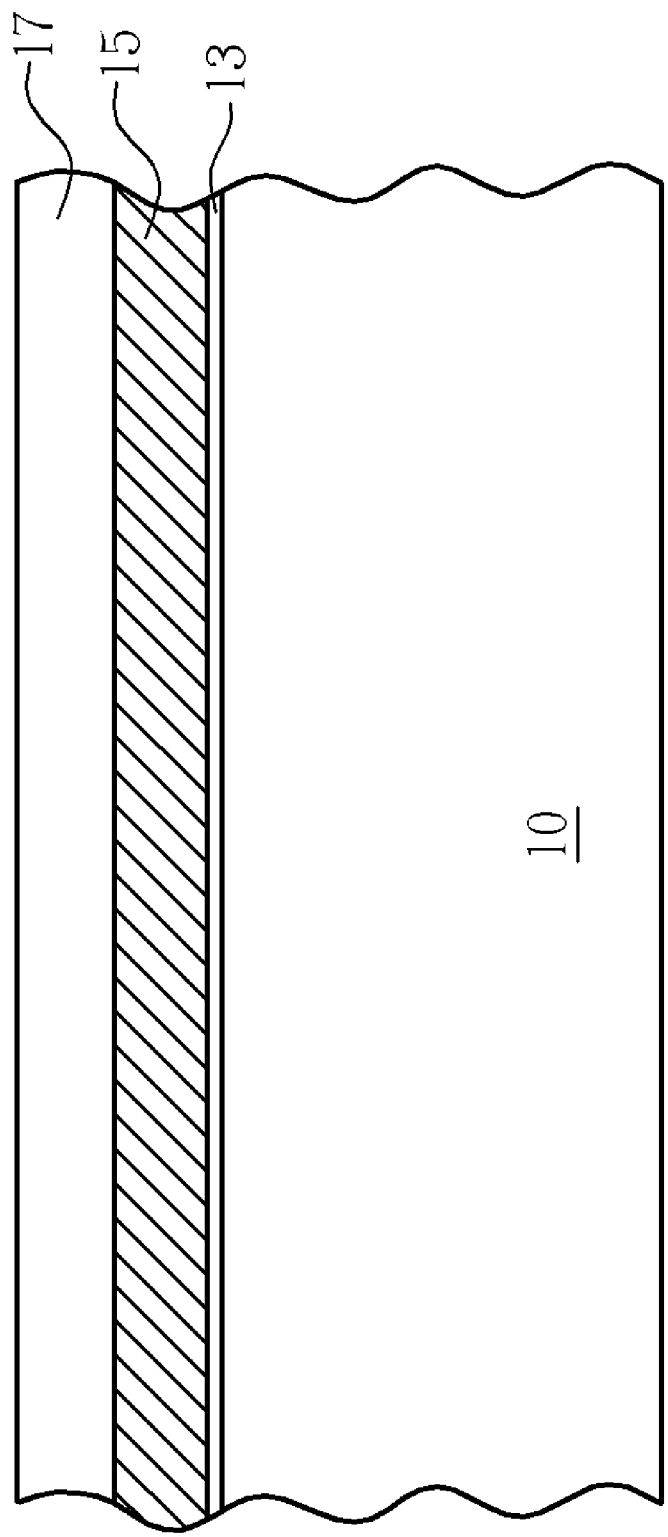
FIG. 4 is a schematic cross-sectional view of a semiconductor wafer having a pad oxide layer, a pad nitride layer, and a photoresist layer thereon in an embodiment according to the present invention.
Figure 5:
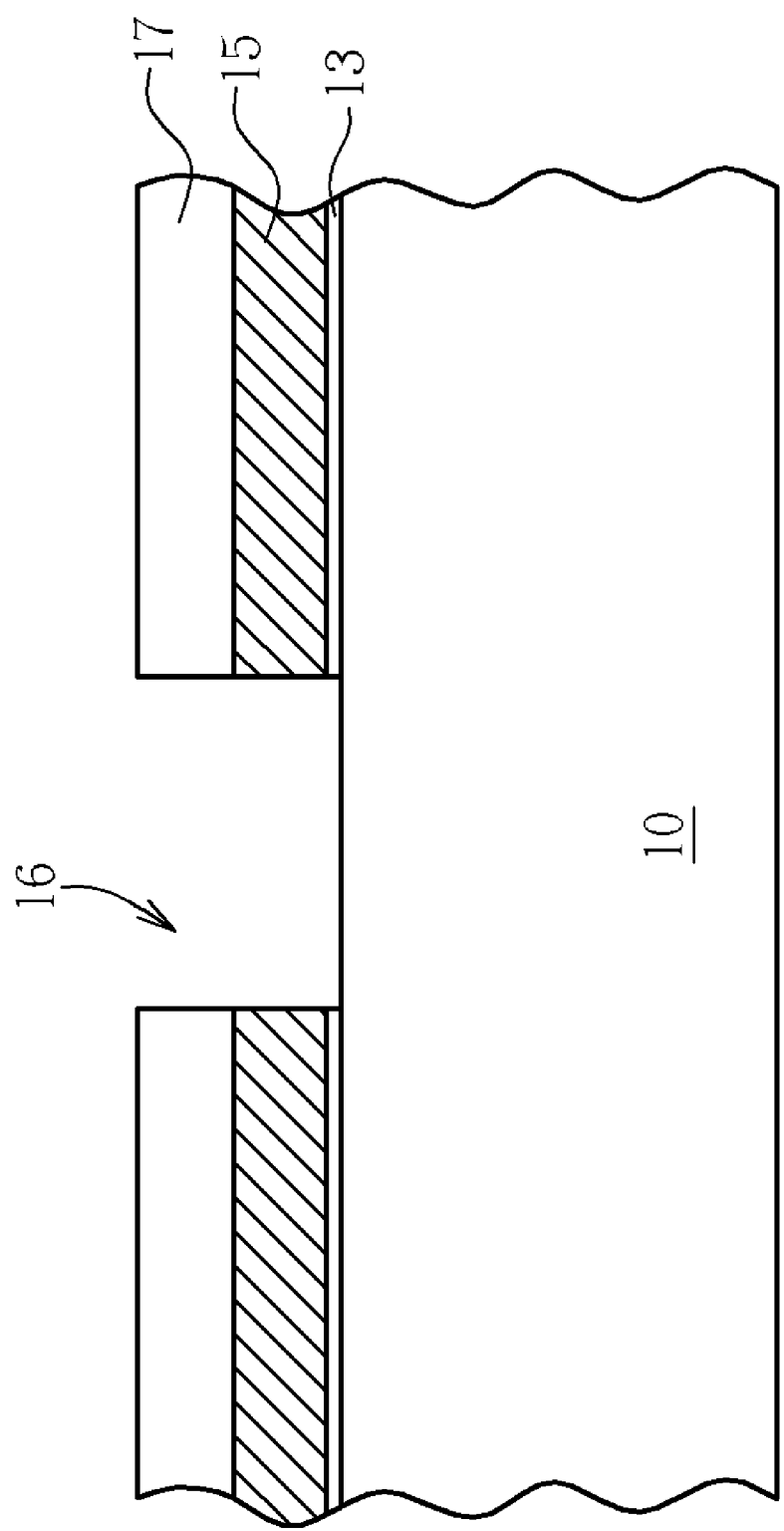
FIG. 5 is a schematic cross-sectional view of a semiconductor wafer having an opening etched into the pad oxide layer and a pad nitride layer in an embodiment according to the present invention.

The present invention will be described more specifically hereinafter. Please refer to FIGS. 4-7 and 9-12, which show schematic cross-sectional views indicating an embodiment of the STI manufacturing process according to the present invention. Features of the invention are not drawn to scale in the drawings. As shown in FIG. 4, first, a semiconductor substrate 10 is provided. A pad oxide layer 13, a pad nitride layer 15, and a photoresist layer 17 are formed on the semiconductor substrate 10. The pad oxide layer 13 comprises preferably silicon oxide, and the pad nitride layer 15 preferably comprises silicon nitride. As shown in FIG. 5, a photoresist pattern is formed by a lithography process to expose a part of the pad nitride layer 15, and the exposed pad nitride layer 15 and pad oxide layer 13 therebeneath are etched according to know processes in the art, preferably a dry etch process, to form an opening 16 that exposes an STI area to be etched into the substrate 10.

Figure 6:
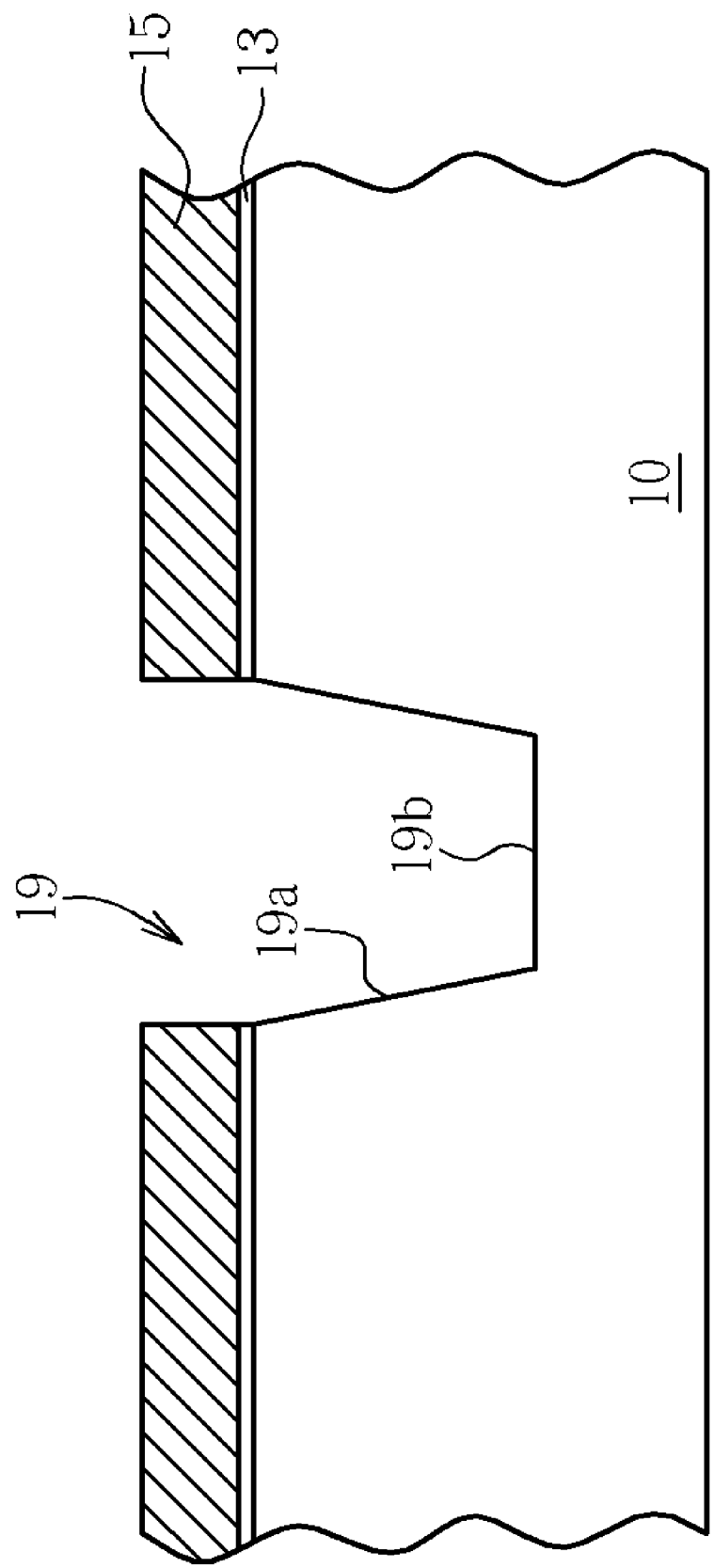
FIG. 6 is a schematic cross-sectional view of a semiconductor wafer having a shallow trench etched into the substrate and the photoresist layer removed in an embodiment according to the present invention.

Next, as shown in FIG. 6, using the pad nitride layer 15 as a hard mask, another dry etching process is carried out to etch the exposed substrate 10 through the opening 16, thereby forming a shallow trench 19. The depth of the shallow trench 19 typically ranges between about 2000 Å and 4500 Å, but not limited thereto. The formed shallow trench 19 preferably has slightly oblique, tapered sidewalls 19a and a flat bottom 19b. After the shallow trench etching process, the isolation trench may be wet cleaned using cleaning solutions known in the art. However, it is noticed that the surface layer of the semiconductor substrate at the bottom 19b, such as an amorphous silicon layer, resulted after etching, often has a substance containing carbon or oxygen (not shown), such as CO, $H_2O$, $CO_2$, $O_2$, or other substance containing carbon or oxygen existing in the amorphous silicon surface layer or shallow layer and can not be removed by an RCA wet cleaning solution. The formation of the substance containing carbon or oxygen is probably due to the photoresist layer.

Figure 7:
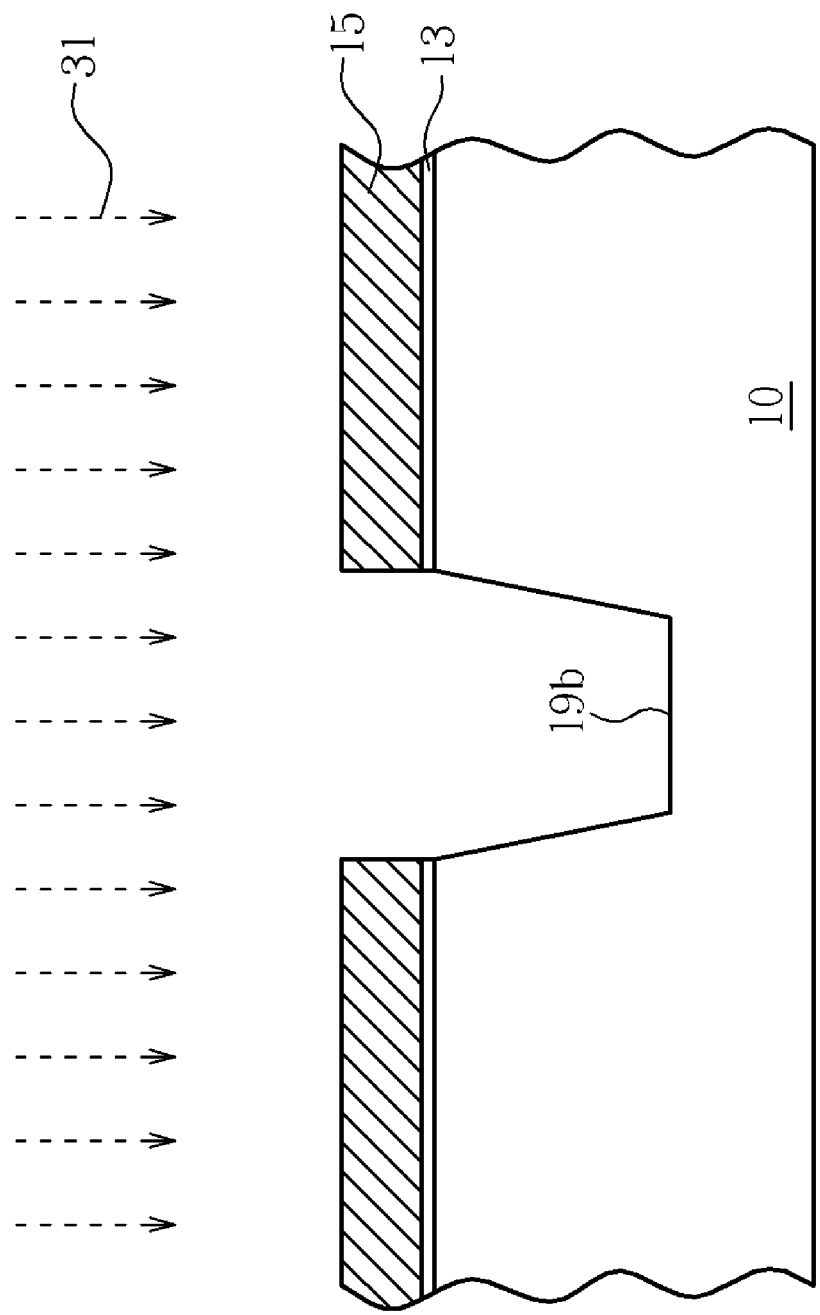
FIG. 7 is a schematic graph showing a bombardment on the bottom surface of the shallow trench by an inert gas in an embodiment according to the present invention.

One of the features of the present invention is to remove the substance containing carbon or oxygen formed on the bottom 19b of the shallow trench. The removal may be performed by, for example, as shown in FIG. 7, using an inert gas to perform a bombardment 31 on the bottom surface of the shallow trench to remove a surface layer of the shallow trench bottom. When the surface layer is removed, the substance containing carbon or oxygen is removed at the same moment, and thus the subsequent steps will not adversely effected by such substance to lead bubble defects. The inert gas is useful because it will not react with the material on the semiconductor substrate. The inert gas may be for example argon or helium gas. The thickness of the surface layer to be removed is not particularly limited, as long as the designed profile of the device to be made is not adversely affected and the profile of the hard mask are not severely changed to adversely affect the function of masking. For example, the removal of several angstroms to 100 angstroms of surface layer of the shallow trench bottom will not harm the profile of the hard mask. The removal of a thin layer should be enough to remove the substance containing carbon or oxygen, or at least the bubble effects can be alleviated.

The bombardment to the bottom surface of the shallow trench may be, for example, in a way of plasma sputtering. The plasma sputtering may be performed using the etching tool used when forming the shallow trench, that is, using the same plasma-etching tool to perform a bombardment. Alternatively, the plasma sputtering may be performed in the chamber in which an HDPCVD deposition will be subsequently performed and argon or helium supplied by the HDPCVD tool may be used as the inert gas. Thus, the surface treatment of the shallow trench bottom can be conveniently accomplished. Alternatively, the surface treatment can be performed in other chamber or tool and it should be not particularly limited.

For example, when the HDPCVD tool is used and the shallow trench bottom comprises an amorphous silicon, an argon plasma may be used to bombard the bottom surface, using RF bias at a power in a range between 500 watt and 4000 watt, under a pressure of 0.1 to 10 torrs and at a temperature of about 250 to 450° C. for 1 to 20 seconds. The range of the parameters is mentioned for illustration, and, as long as the surface layer of the shallow trench bottom can be removed, the parameters may be used without particular limitation. For example, using a power of 3000 watt to perform bombardment for 3 seconds, about 10 Å of silicon layer can be removed.

Figure 8:
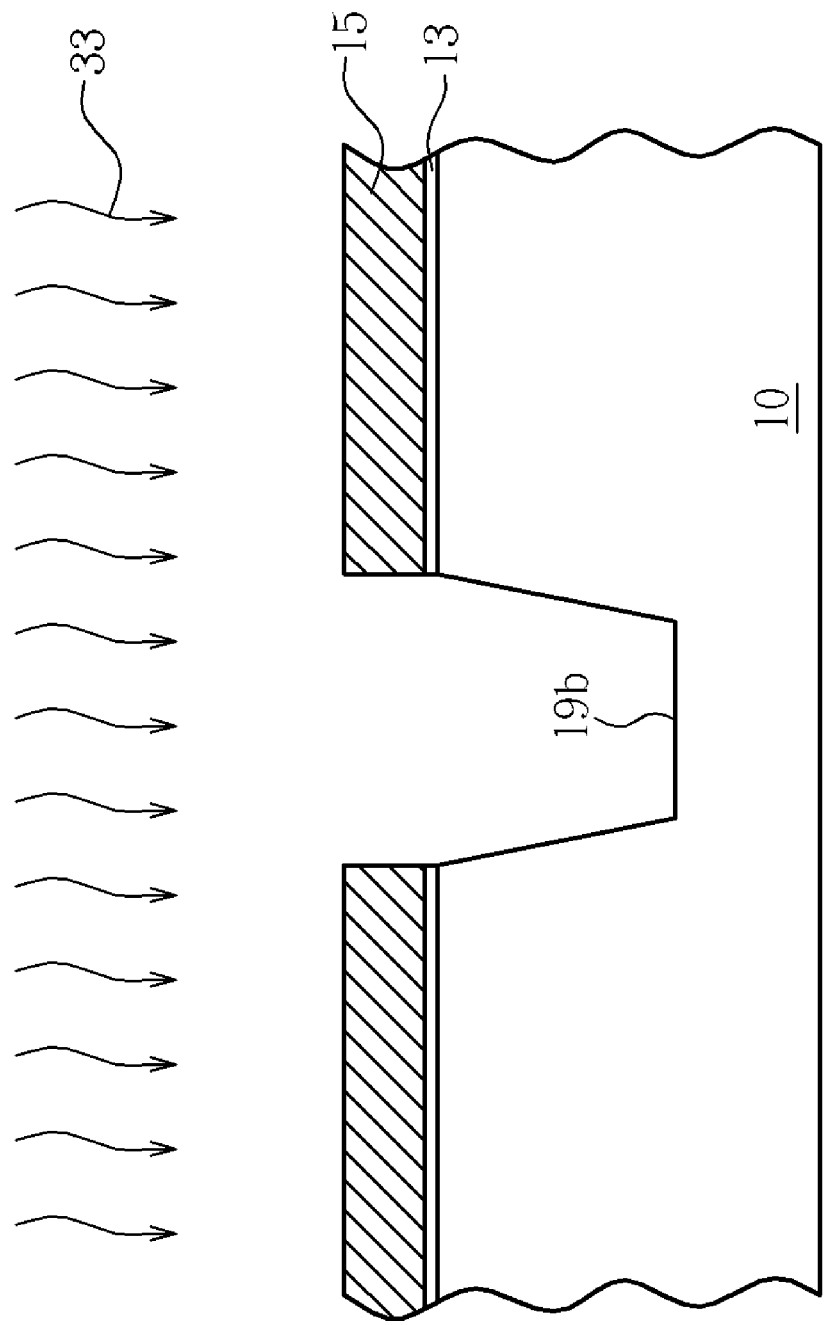
FIG. 8 is a schematic diagram showing a heat treatment on the bottom surface of the shallow trench in another embodiment according to the present invention.

Alternatively, as shown in FIG. 8, removing the substance containing carbon or oxygen on the bottom surface of the shallow trench may be carried out by heating to expel the substance containing carbon or oxygen in the surface layer of the silicon substrate of the bottom surface of the shallow trench. The way for heating is not particularly limited and for example a heating performed by a radio frequency induction equipment may be used. The temperature used may be higher than 400° C. The higher temperature is used, the shorter time period for heating is expected. The highest temperature useful depends on the tolerance of the tool and thus is not particularly limited.

The heating may be performed after the photoresist layer 17 is stripped and before the oxide liner 20 is formed. Therefore, the heating process and the etching of the shallow trench may be performed in-situ in a same chamber, that is, the etching process for the pad nitride layer, the pad oxide layer, and the semiconductor substrate and the removal of the photoresist layer, and the heating of the bottom surface of the shallow trench may be conveniently performed in-situ in a same chamber of a same tool. Alternatively, the heating process may be performed in a chamber in which the followed-up deposition process is performed. For example, the heating process may be performed in a chamber of an HDPCVD tool using the radio frequency induction equipment, and this possesses the convenience for the manufacturing process. Alternatively, the heating process may be performed in other chamber or tool and is not particularly limited.

Figure 9:
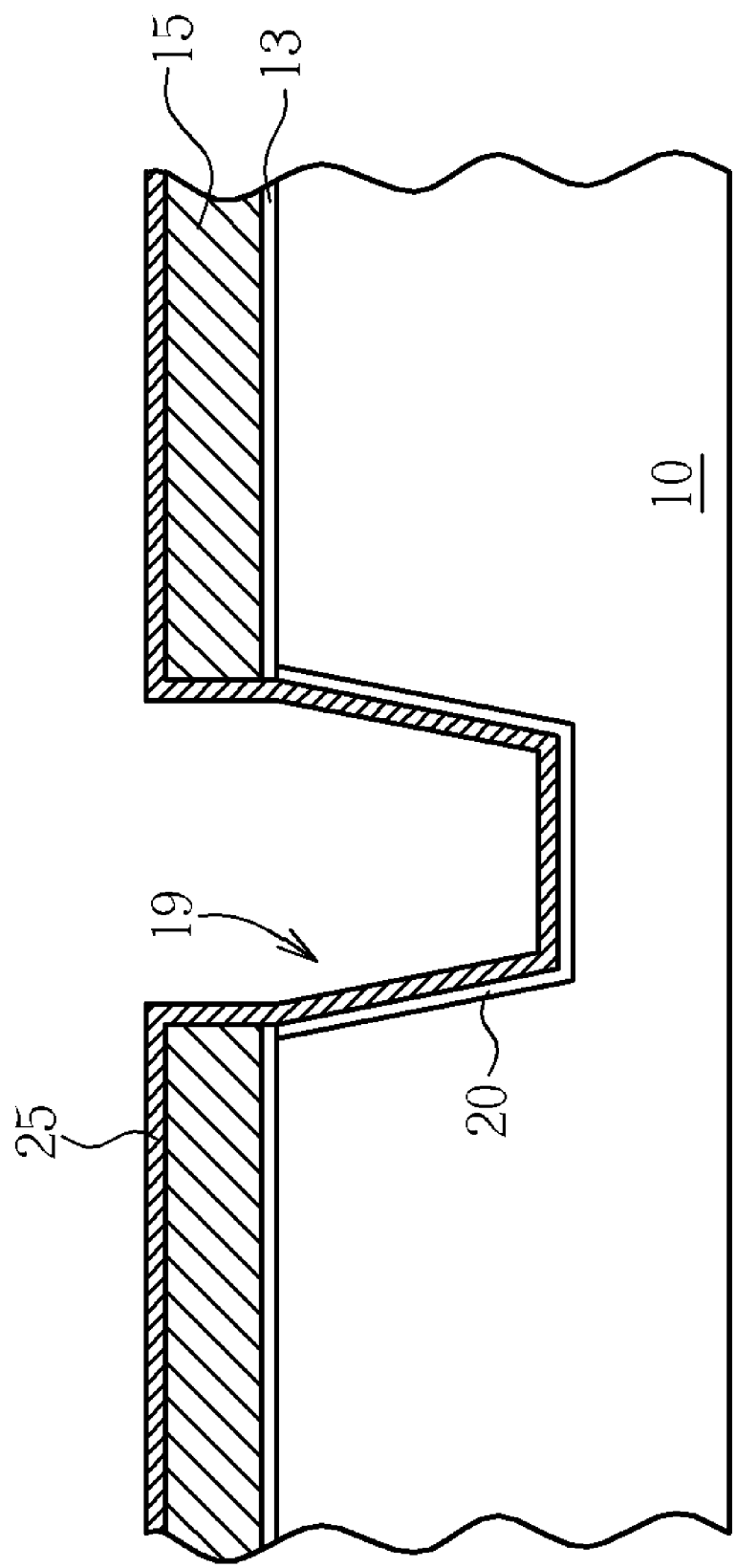
FIG. 9 is a schematic cross-sectional view of a semiconductor wafer having a thermal oxide layer and a silicon nitride liner formed on bottom and sidewalls of the shallow trench in an embodiment according to the present invention.

Thereafter, as shown in FIG. 9, the process of manufacturing an STI is continued. A thermal oxide liner 20 is grown using a high temperature oxidation process at about 1000° C. for about 3 to 10 minutes. Preferably, the thermal oxide liner has a thickness of about 50 to 200 Å. A silicon nitride liner 25 preferably having a thickness of about 20 to 100 Å is then deposited over the semiconductor substrate 10 and within the shallow trench 19 using any suitable chemical vapor deposition (CVD) methods known in the art such as low-pressure chemical vapor deposition (LPCVD). The silicon nitride liner 25 conformably covers the pad nitride layer 15 and the thermal oxide liner 20.

Figure 10:
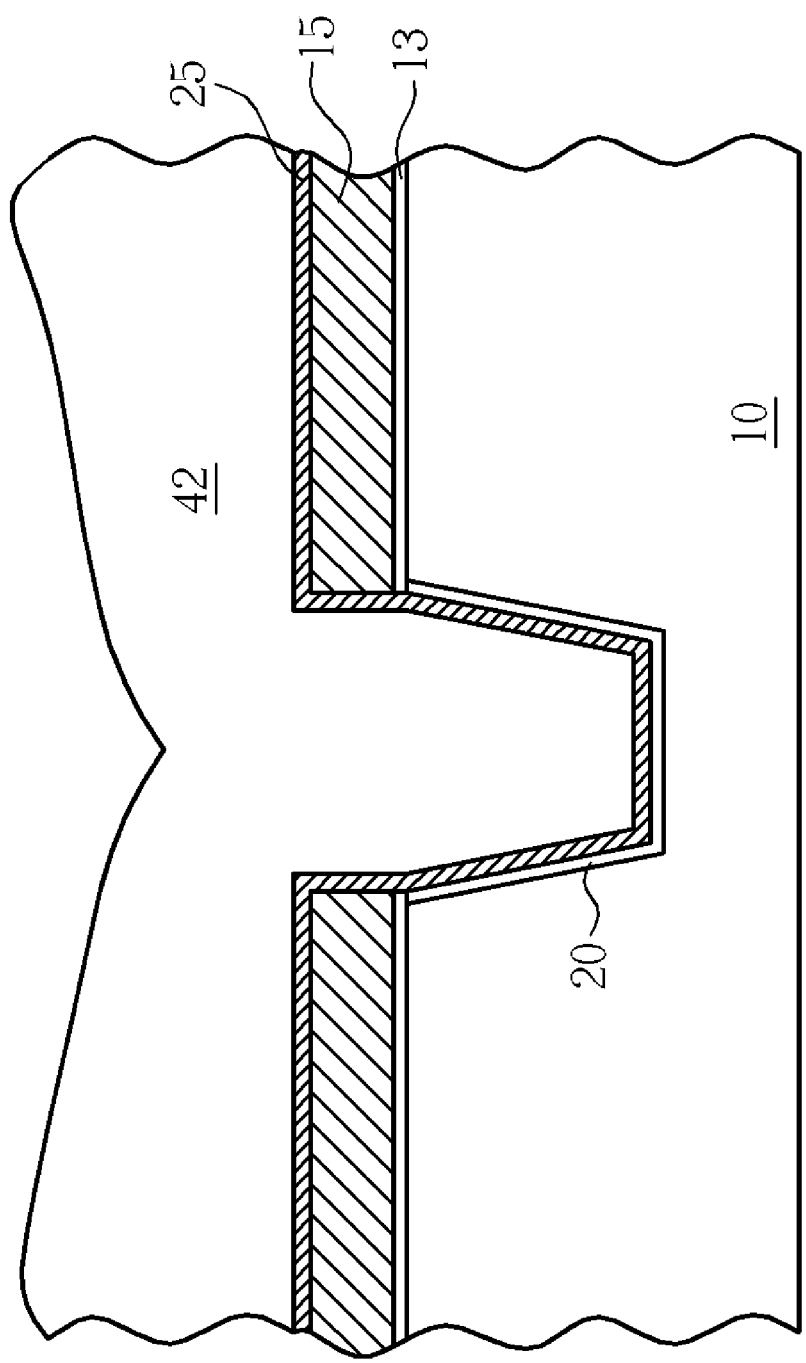
FIG. 10 is a schematic cross-sectional view of a semiconductor wafer having the shallow trench filled with a dielectric layer in an embodiment according to the present invention.

As shown in FIG. 10, a CVD process is performed. A dielectric layer 42 is deposited and filled into the shallow trench 19 to form an isolation structure. According to the preferred embodiment, the dielectric layer 42 is HDPCVD oxide, which can be deposited in a commercial available HDPCVD tool by using precursors including silane and nitrous oxide ($N_2O$). In other cases, the dielectric layer 42 to fill the shallow trench may be deposited by atmospheric pressure chemical vapor deposition (APCVD) or sub-atmospheric CVD (SACVD) methods.

Figure 11:
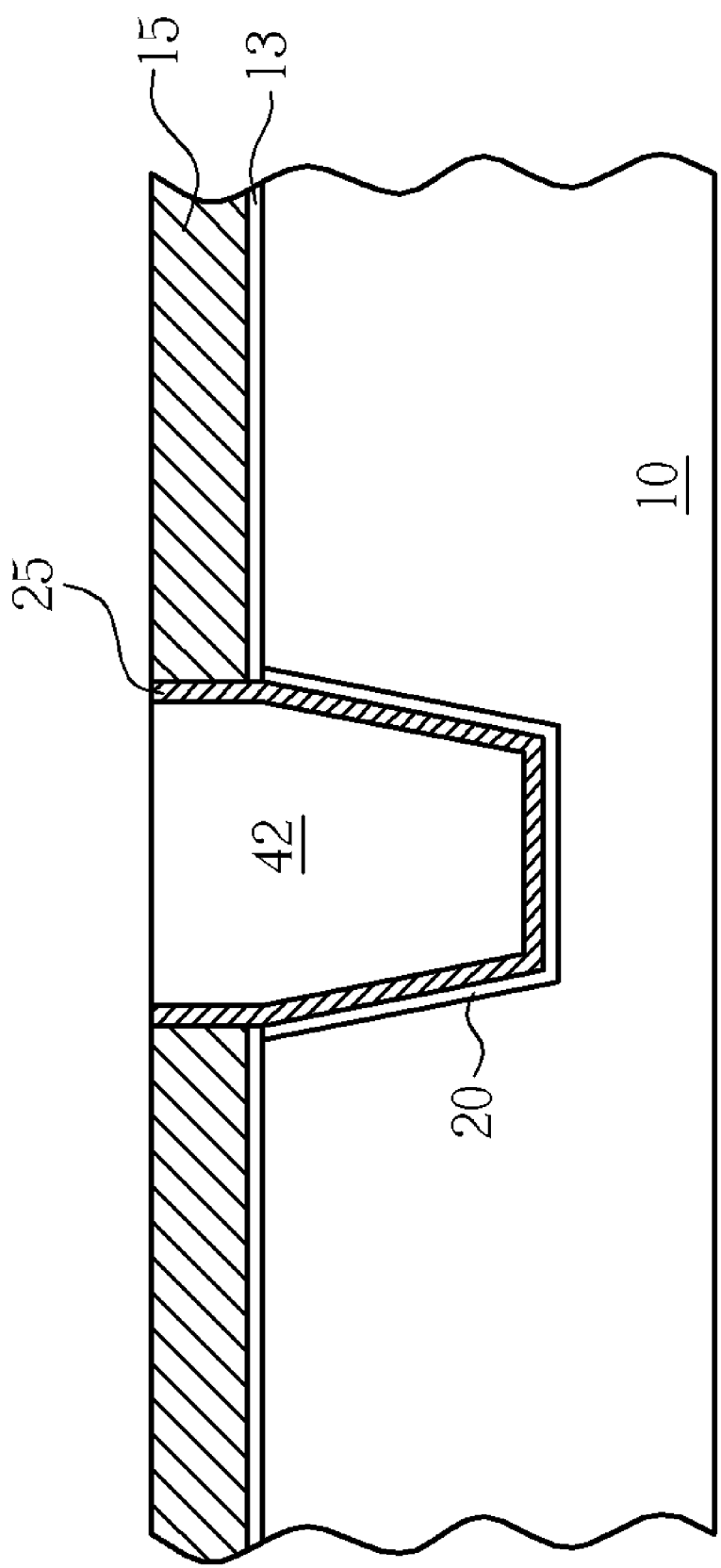
FIG. 11 is a schematic cross-sectional view of a semiconductor wafer having the dielectric layer polished back to expose the pad nitride layer in an embodiment according to the present invention.
Figure 12:
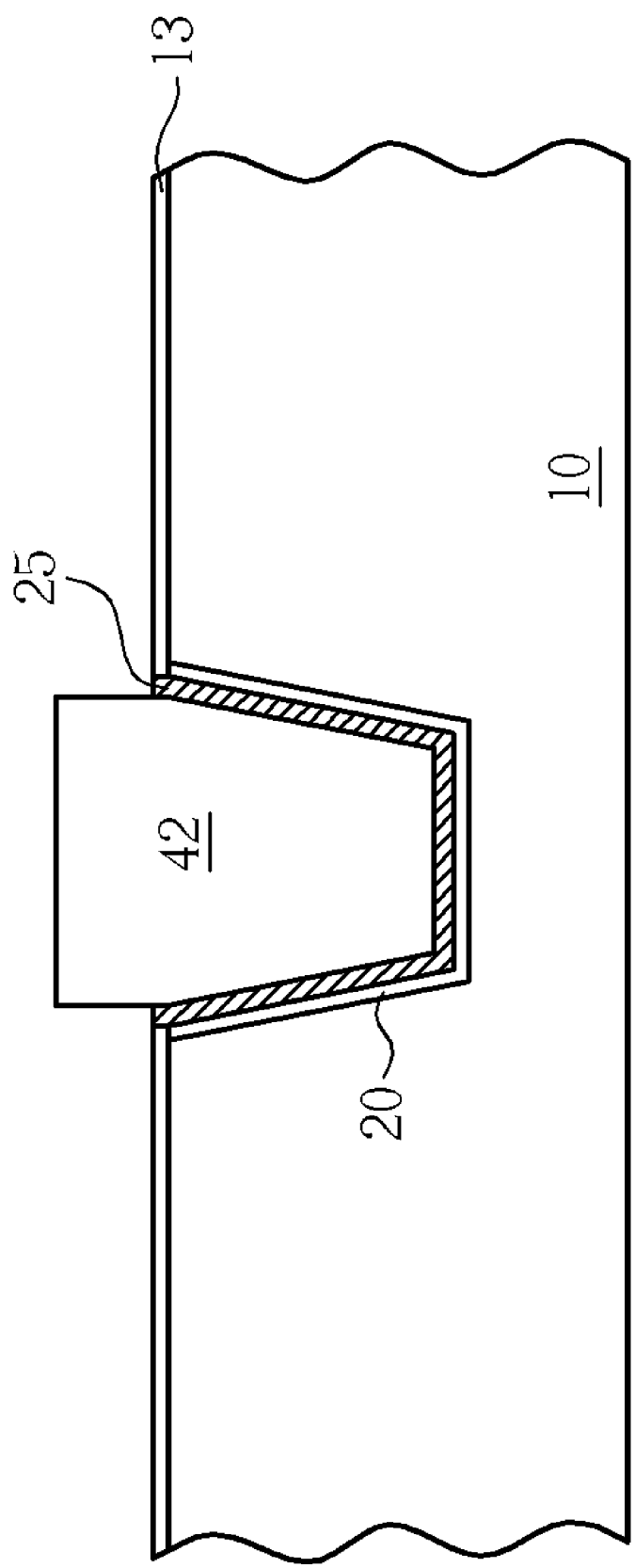
FIG. 12 is a schematic cross-sectional view of a semiconductor wafer having the pad nitride layer removed in an embodiment according to the present invention.

Thereafter, as shown in FIG. 11, using the pad nitride layer 15 as a polishing stop layer, the excess dielectric layer 42 outside the shallow trench 19 is then further removed by conventional chemical mechanical polishing (CMP) methods to accomplish planarization. And, as shown in FIG. 12, the exposed pad nitride layer 15 is further selectively removed using any suitable methods known in the art, for example, wet etching such as etching solutions containing hot phosphoric acid or the like, or dry etching. An exposed part of the silicon nitride liner 25 will be etched simultaneously with the wet etching.

Figure 13:
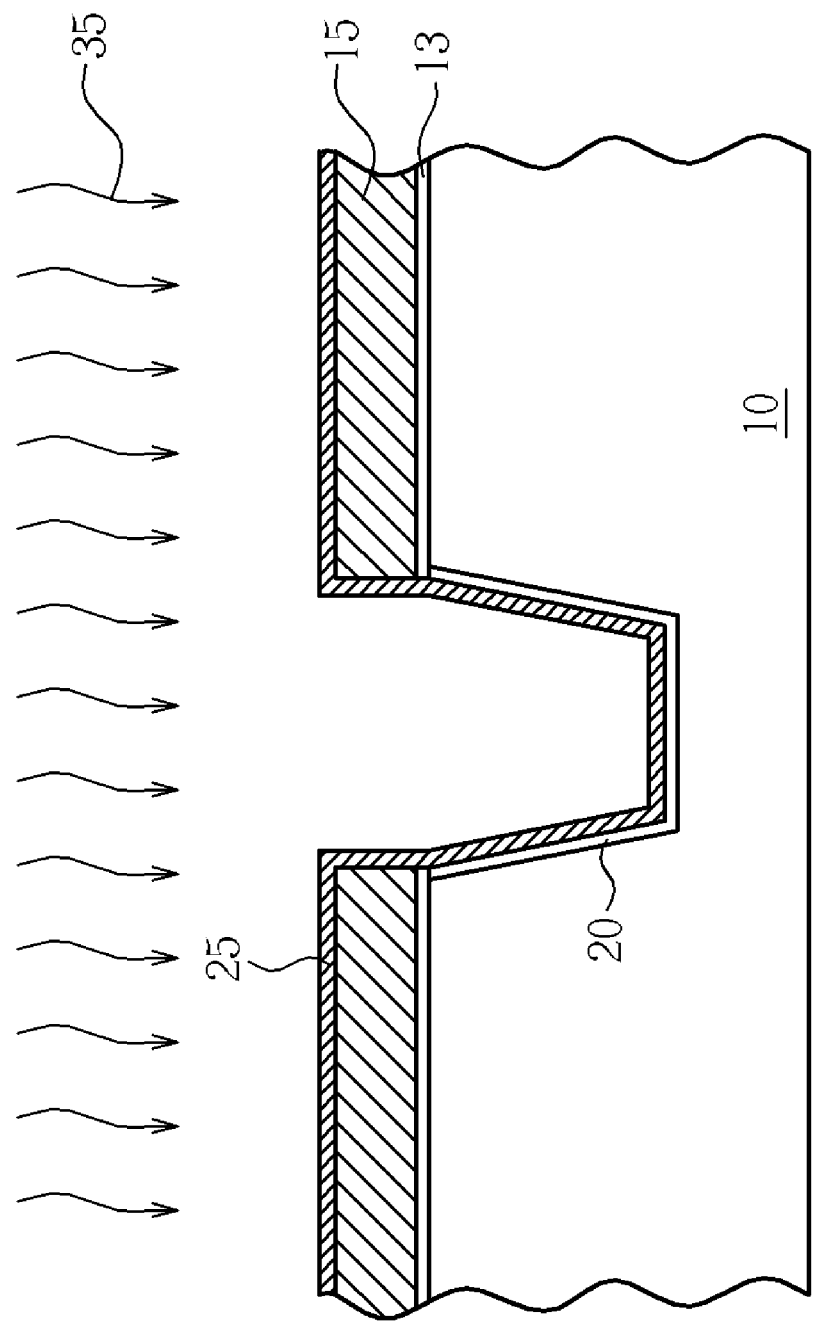
FIG. 13 is a schematic diagram showing a heat treatment on the bottom surface of the shallow trench after formation of the thermal oxide liner and the silicon nitride liner in still another embodiment according to the present invention.

In the embodiment of the process of manufacturing an STI according to the present invention described above, a bottom of a shallow trench is surface-treated to remove a substance containing carbon or oxygen existing on the bottom surface after the shallow trench is etched and before the oxide liner is formed. Alternatively, as shown in FIG. 13, in still another embodiment according to the present invention, removing a substance containing carbon or oxygen existing on the bottom surface of the shallow trench may be performed after the oxide liner 20 and the silicon nitride liner 25 are formed. More specifically, after the shallow trench is etched (as shown in FIG. 6), the step of removing a substance containing carbon or oxygen as shown in FIG. 7 or 8 is not performed, and instead, the steps of forming the oxide liner 20 and the silicon liner 25 as shown in FIG. 9 are subsequently performed. Thereafter, after the silicon nitride layer 25 is formed or before the CVD process is performed to fill the shallow trench with a dielectric layer 42, a heating process 35 is performed to remove the substance containing carbon or oxygen existing on the shallow trench bottom surface. Thereafter, a process of manufacturing an STI is continued to form the dielectric layer 42, and further to perform the CMP process and to remove the pad nitride layer, as shown in FIGS. 10 to 12.

As described above, the heating process 35 may be performed before the shallow trench fill is performed using the CVD process. In such case, the heating process may be performed in a same chamber in which the subsequent HDPCVD process will be performed, and, accordingly, the heating process also provides "pre-heat" for the CVD process. A gas related to the process or an inert gas can be added into the heating chamber for improving heat transferring. The gas may be for example one selected from the group consisting of oxygen, helium, argon, and hydrogen gas, which will not adversely affect the subsequent CVD process. The temperature for the heating may be 400° C. or higher to effectively remove the substance containing carbon or oxygen. The heat may be provided by the RF device of the CVD tool. For example, a low frequency of 1300 Hz or high frequency of 3100 Hz may be used.

Above-mentioned heating process 35 also may be performed in a chamber or tool in which the silicon nitride liner is formed or in other tool, and is not particularly limited. Merely, it is more convenient for the process performed in situ.

In the embodiment, although the heating process to remove the substance containing carbon or oxygen is performed after the oxide liner 20 and the silicon nitride liner 25 are formed on the bottom surface of the shallow trench, the substance containing carbon or oxygen still can be effectively removed.

As compared with conventional techniques, in the process of manufacturing an STI according to the present invention, the substance containing carbon or oxygen on the bottom surface of the shallow trench formed by etching is removed, and therefore the bubble defects tending to occur due to formation of the silicon nitride liner can be avoided.

All combinations and sub-combinations of the above-described features also belong to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process of manufacturing a shallow trench isolation for avoiding bubble defects, comprising:
   providing a semiconductor substrate comprising a pad oxide layer and a pad nitride layer formed thereon;
   forming a photoresist layer on the pad nitride layer and performing a photolithography process to pattern the photoresist layer and expose a part of the pad nitride layer;
   etching the exposed pad nitride layer and the pad oxide layer underneath the pad nitride layer to form an opening;
   etching the semiconductor substrate through the opening to form a shallow trench;
   removing the photoresist layer, and thereby leading to a substance containing carbon or oxygen remaining on a bottom surface of the shallow trench;
   performing an RCA wet cleaning on the shallow trench, wherein the substance containing carbon or oxygen is not removable by the RCA wet cleaning;
   using an inert gas to bombard the bottom surface of the shallow trench to remove a surface layer of the bottom surface for removing the substance containing carbon or oxygen on the bottom surface of the shallow trench;
   forming an oxide liner on the surface of the shallow trench;
   forming a silicon nitride liner on the oxide liner; and
   performing a chemical vapor deposition process to deposit a dielectric layer to fill the shallow trench.

2. The process of claim 1, wherein the inert gas comprises argon or helium.

3. The process of claim 1, wherein the surface layer removed has a thickness of several angstroms to 100 angstroms.

4. The process of claim 1, wherein using an inert gas to bombard the bottom surface of the shallow trench is performed using a plasma sputtering process.

5. The process of claim 1, wherein the semiconductor substrate comprises silicon.

6. A process of treating bottom surface of a shallow trench for avoiding bubble defects, comprising:
   providing a semiconductor substrate comprising a shallow trench formed by etching, wherein a photoresist layer utilized in processes has been removed and the bottom surface of the shallow trench has a substance containing carbon or oxygen;
   performing an RCA wet cleaning on the shallow trench, wherein the substance containing carbon or oxygen is not removable by the RCA wet cleaning; and
   using an inert gas to bombard the bottom surface of the shallow trench to remove a surface layer of the bottom surface for removing the substance containing carbon or oxygen to avoid bubble defects in the shallow trench.

* * * * *